United States Patent
Ozaki et al.

(10) Patent No.: US 11,088,044 B2
(45) Date of Patent: Aug. 10, 2021

(54) COMPOUND SEMICONDUCTOR DEVICE AND FABRICATION METHOD THEREFOR, AND AMPLIFIER

(71) Applicant: FUJITSU LIMITED, Kawasaki (JP)

(72) Inventors: Shirou Ozaki, Yamato (JP); Toshihiro Ohki, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/687,745

(22) Filed: Nov. 19, 2019

(65) Prior Publication Data

US 2020/0203519 A1  Jun. 25, 2020

(30) Foreign Application Priority Data

Dec. 20, 2018  (JP) .............. JP2018-238510

(51) Int. Cl.
| | | |
|---|---|---|
| *H01L 29/76* | (2006.01) | |
| *H01L 21/336* | (2006.01) | |
| *H01L 23/31* | (2006.01) | |
| *H01L 29/778* | (2006.01) | |
| *H01L 29/205* | (2006.01) | |
| *H01L 29/20* | (2006.01) | |
| *H03F 3/21* | (2006.01) | |
| *H01L 23/373* | (2006.01) | |
| *H01L 21/02* | (2006.01) | |
| *H01L 21/28* | (2006.01) | |
| *H01L 29/51* | (2006.01) | |

(52) U.S. Cl.
CPC .... *H01L 23/3171* (2013.01); *H01L 21/02115* (2013.01); *H01L 21/02186* (2013.01); *H01L 21/28264* (2013.01); *H01L 23/3732* (2013.01); *H01L 29/2003* (2013.01); *H01L 29/205* (2013.01); *H01L 29/517* (2013.01); *H01L 29/7786* (2013.01); *H03F 3/21* (2013.01)

(58) Field of Classification Search
CPC .............. H01L 29/7786; H01L 29/205; H01L 29/2003; H01L 23/3732; H01L 21/02186; H01L 21/02115; H01L 21/23; H01L 21/3171; H01L 29/66462; H01L 29/513; H01L 29/517; H01L 29/41766; H01L 21/02271; H01L 21/02348; H01L 23/291; H01L 21/28264; H03F 3/195; H03F 3/245; H03F 3/21; H03F 1/3247; H03F 2200/451; H03F 2200/207
See application file for complete search history.

(56) References Cited

U.S. PATENT DOCUMENTS

| | | | |
|---|---|---|---|
| 2012/0217544 A1* | 8/2012 | Ohki ............... | H01L 29/7787 257/194 |
| 2013/0001646 A1* | 1/2013 | Corrion ............ | H01L 29/66462 257/194 |

(Continued)

FOREIGN PATENT DOCUMENTS

| | | |
|---|---|---|
| JP | 2016-062837 | 4/2016 |
| JP | 2016-201300 | 12/2016 |

*Primary Examiner* — Shouxiang Hu
(74) *Attorney, Agent, or Firm* — Fujitsu Patent Center (57) ABSTRACT

A compound semiconductor device includes a compound semiconductor stack structure, a protective film provided on the compound semiconductor stack structure and containing titanium oxide, and a polycrystalline diamond film provided on the protective film.

12 Claims, 9 Drawing Sheets

(56) References Cited

U.S. PATENT DOCUMENTS

| | | | |
|---|---|---|---|
| 2013/0256690 A1* | 10/2013 | Nakamura | H01L 29/2003 257/76 |
| 2015/0295074 A1* | 10/2015 | Ozaki | H01L 21/02126 257/194 |
| 2016/0079371 A1* | 3/2016 | Furukawa | H01L 21/28264 257/76 |
| 2016/0087287 A1 | 3/2016 | Koizumi | |
| 2016/0301087 A1 | 10/2016 | Koizumi et al. | |

* cited by examiner

(PRIOR ART)

US 11,088,044 B2

COMPOUND SEMICONDUCTOR DEVICE AND FABRICATION METHOD THEREFOR, AND AMPLIFIER

CROSS-REFERENCE TO RELATED APPLICATIONS

This application is based upon and claims the benefit of priority of the prior Japanese Patent Application No. Patent Application 2018-238510, filed on Dec. 20, 2018, the entire contents of which are incorporated herein by reference.

FIELD

The embodiments discussed herein are related to a compound semiconductor device and a fabrication method therefor, and an amplification unit.

BACKGROUND

A compound semiconductor device for which a compound semiconductor includes, for example, a field-effect transistor, especially, a high electron mobility transistor (HEMT). It is expected that a GaN-HEMT is practically used, for example, for an amplification unit.

[Patent Document 1] Japanese Laid-Open Patent Application No. 2016-062837

[Patent Document 2] Japanese Laid-Open Patent Application No. 2016-201300

Incidentally, in the case where a GaN-HEMT is used, for example, for an amplification unit or in a like case, a heat dissipation countermeasures is desirable in order to suppress a failure and characteristic deterioration caused by heat generation.

As the heat dissipation countermeasure, it is conceivable to provide a polycrystalline diamond film at the surface side of a compound semiconductor device.

However, in the polycrystalline diamond film, graphite exists as impurity at the grain boundaries. The graphite has a heat conductivity lower than that of the diamond and makes a cause of deterioration of a heat dissipation effect.

SUMMARY

According to one aspect, a compound semiconductor device includes a compound semiconductor stack structure, a protective film provided on the compound semiconductor stack structure and containing titanium oxide, and a polycrystalline diamond film provided on the protective film.

According to the one aspect, an amplification unit includes an amplifier that amplifies an input signal, and in the amplification unit, the amplifier includes a transistor, and the transistor includes a compound semiconductor stack structure, a protective film provided on the compound semiconductor stack structure and containing titanium oxide, and a polycrystalline diamond film provided on the protective film.

According to the one aspect, a fabrication method for a compound semiconductor device includes forming a compound semiconductor stack structure, forming a protective film containing titanium oxide on the compound semiconductor stack structure, and forming a polycrystalline diamond film on the protective film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In the following, a compound semiconductor device, a fabrication method therefor and an amplification unit according to an embodiment of the present technology are described with reference to the drawings.

First Embodiment

First, a compound semiconductor device and a fabrication method therefor according to a first embodiment are described with reference to FIGS. 1 to 9.

The compound semiconductor device according to the present embodiment is, for example, a compound semiconductor device that includes a nitride semiconductor stack structure for which a nitride semiconductor is used.

In the present embodiment, the compound semiconductor device is described taking, as an example, an FET for which a nitride semiconductor is used, particularly, an AlGaN/GaN-HEMT including a compound semiconductor stack structure (HEMT structure) in which GaN is used for an electron transit layer and AlGaN is used for an electron supply layer.

It is to be noted that the AlGaN/GaN-HEMT is referred to also as AlGaN/GaN-FET. Further, the compound semiconductor stack structure is referred to also as III-V group compound semiconductor stack structure, GaN-based compound semiconductor stack structure or nitride semiconductor stack structure. Further, the compound semiconductor device is referred to also as III-V group compound semiconductor device, GaN-based compound semiconductor device or nitride semiconductor device.

Figure 1:
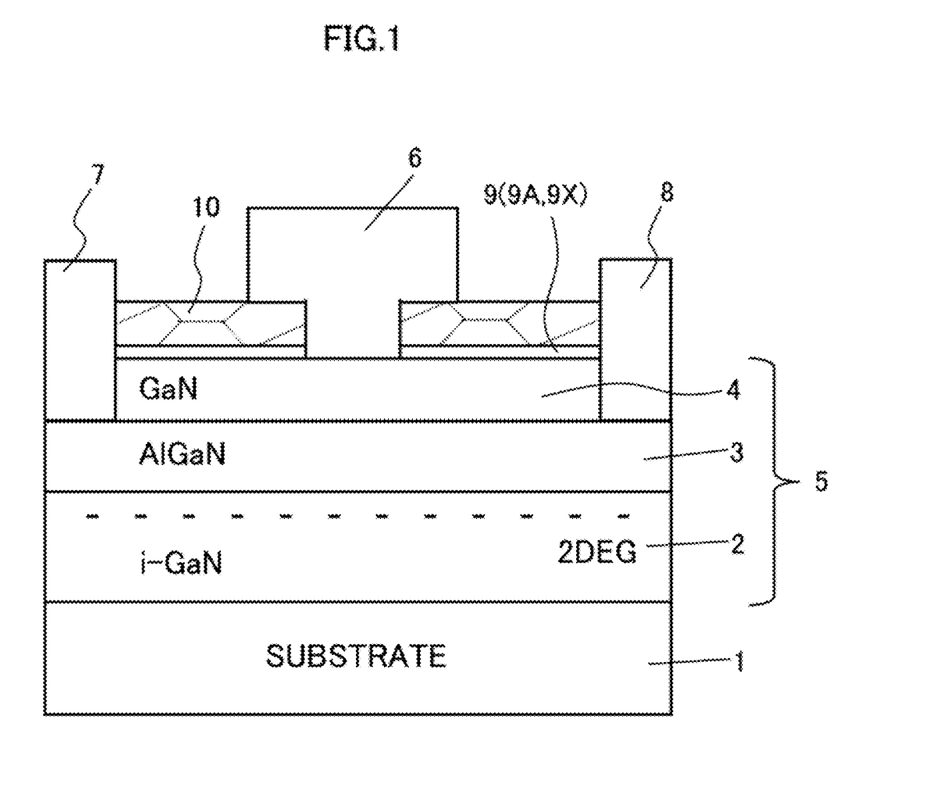
FIG. 1 is a cross sectional view depicting a configuration of a compound semiconductor device according to the present embodiment.

As depicted in FIG. 1, the present AlGaN/GaN-HEMT includes a compound semiconductor stack structure 5 in which a GaN electron transit layer (channel layer) 2, an AlGaN spacer layer (not depicted), an AlGaN electron supply layer 3 and a GaN cap layer 4 are stacked on an SiC substrate 1.

In this case, two-dimensional electron gas (2DEG) is generated in the proximity of the interface between the electron transit layer 2 find the electron supply layer 3 (particularly, a spacer layer).

It is to be noted that the SiC substrate 1 is referred to also as substrate or semiconductor substrate. Further, a buffer layer may be provided as occasion demands. However, the spacer layer or the cap layer 4 may be omitted. Further, an AlN cap layer may be used in place of the GaN cap layer 4. Further, each of the semiconductor layers 2 to 4 is referred to also as III-V group semiconductor layer, nitride semiconductor layer or compound semiconductor layer.

Further, in the present embodiment, a gate electrode 6 is provided over the compound semiconductor stack structure 5, namely, on the GaN cap layer 4 configuring the compound semiconductor stack structure 5.

Further, a source electrode 7 and a drain electrode 8 are provided in a spaced relationship from each other at the opposite sides of the gate electrode 6 sandwiching the gate electrode 6.

The source electrode 7 and the drain electrode 8 are held in contact with the electron supply layer 3. In particular, the source electrode 7 and the drain electrode 8 are provided over the compound semiconductor stack structure 5, namely, on the electron supply layer 3 configuring the compound semiconductor stack structure 5.

Especially, in the present embodiment, a protective film 9 containing titanium oxide (TiOx) is provided on the compound semiconductor stack structure 5 in such a manner as to cover the overall surface of the compound semiconductor stack structure 5.

Here, titanium oxide has insulating properties and a photocatalyst function. Therefore, the protective film 9 has a function as an insulating film and a photocatalyst.

Further, a polycrystalline diamond film 10 is provided on the protective film 9.

It is to be noted that the protective film 9 functions as a surface protecting film upon formation of the polycrystalline diamond film 10. The protective film 9 is referred to also as insulating film or photocatalyst film. It is to be noted that, in FIG. 1, a dotted line in the polycrystalline diamond film 10 indicates a grain boundary and graphite existing at the grain boundary.

In this manner, the polycrystalline diamond film 10 is provided on the surface of the semiconductor layer (here, the GaN cap layer 4) configuring the compound semiconductor stack structure 5 with the protective film 9 interposed therebetween.

Here, the protective film 9 is a titanium oxide film (or a film containing titanium oxide as a main component) 9A.

Further, the protective film 3 and the polycrystalline diamond film 10 are provided between the source electrode 7 and the gate electrode 6 and between the drain electrode 8 and the gate electrode 6. It is to be noted that the configuration is not restrictive, and the protective film 9 and the polycrystalline diamond film 10 may be provided at least between the drain electrode 8 and the gate electrode 6.

Figure 4:
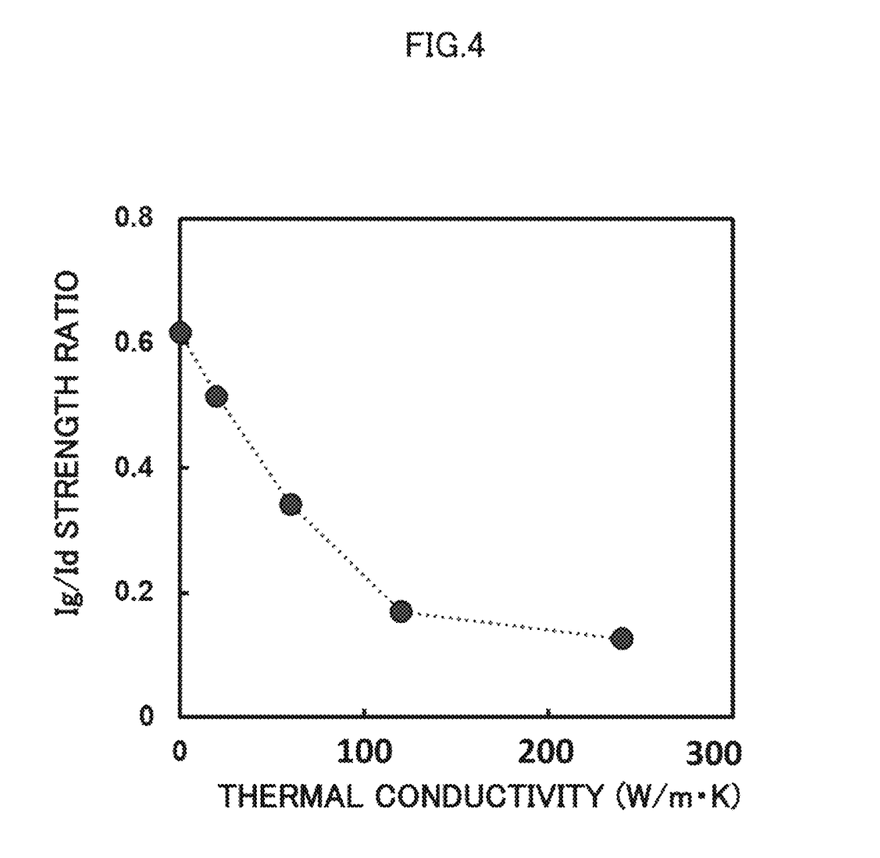
FIG. 4 is a view depicting variation of an Ig/Id strength ratio when UV irradiation time is varied.

Further, it is preferable to set the strength ratio (graphite/diamond) between the graphite and the diamond at a Raman peak of the polycrystalline diamond film 10 to approximately 0.4 or less (for example, refer to FIG. 4). This makes it possible to increase the thermal conductivity to such a degree that effective heat dissipation can be expected.

Incidentally, the AlGaN/GaN-HEMT (compound semiconductor device) configured in such a manner as described above can be fabricated in the following manner.

Figure 2:
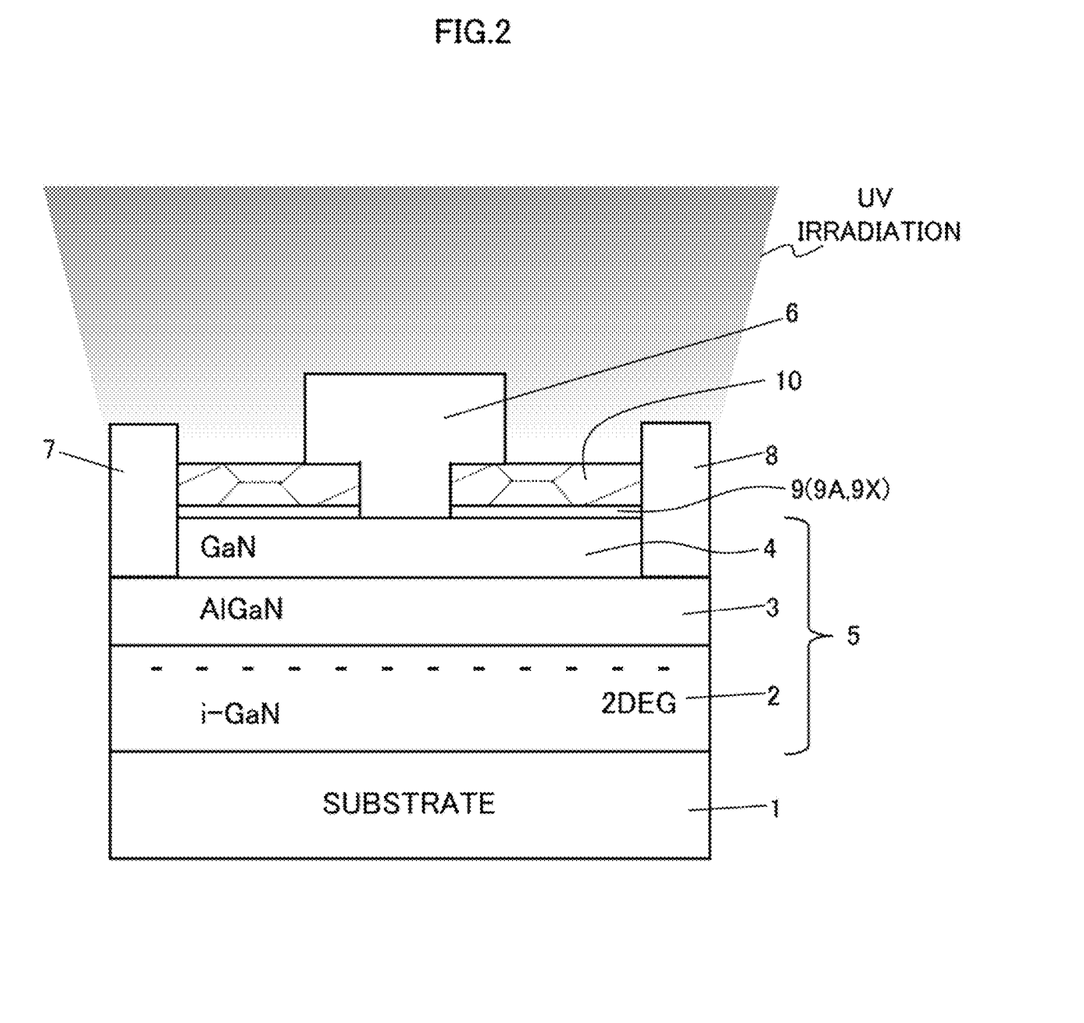
FIG. 2 is a cross sectional view illustrating a fabrication method for a compound semiconductor device according to the present embodiment.

In particular, the fabrication method for the compound semiconductor device includes a step of forming the compound semiconductor stack structure 5, another step of forming the protective film 9 containing titanium oxide on the compound semiconductor stack structure 5, and a further step of forming the polycrystalline diamond film 10 on the protective film 9 (for example, refer to FIG. 2).

Especially, at the step of forming the polycrystalline diamond film 10, it is preferable to irradiate ultraviolet rays during formation of the polycrystalline diamond film 10 (during film formation) or after formation of the polycrystalline diamond film 10 (after film formation) to generate active oxygen (for example, refer to FIG. 2).

Further, it is preferable to irradiate ultraviolet rays within an atmosphere in which one or a plurality of ones of oxygen, ozone, carbon dioxide, carbon monoxide and water vapor are mixed.

Incidentally, such a configuration and a fabrication method as described above are adopted by the following reason.

Development of a semiconductor element (semiconductor device) is being advanced which can perform high output and high voltage operation taking advantage of excellent material characteristics of a nitride semiconductor such as a high withstand voltage and a high saturation speed.

As a semiconductor device in which a nitride semiconductor is used, a great number of reports relating to field-effect transistors, especially, high-electron mobility transistors (HEMTs) are made.

For example, in a regard to a GaN-based HEMT (GaN-HEMT), attention is paid to an AlGaN/GaN-HEMT in which GaN is used as an electron transit layer and AlGaN is used an electron supply layer.

In the AlGaN/GaN-HEMT, distortion arising from a grating constant difference between GaN and AlGaN occurs in AlGaN.

High-density two-dimensional electron gas (2DEG) is obtained by piezoelectric polarization and spontaneous polarization or AlGaN caused by the distortion. Therefore, it is expected that the GaN-HEMT is practically applied to a high-output amplification unit.

It is to be noted that, in the case where a high-output GaN-HEMT is to be used, heat dissipation countermeasures are taken in order to prevent a failure and characteristic deterioration of the device by heat generation.

In this case, a "backside heat dissipation technology" in which a diamond substrate is joined to the back side of a device and a "surface heat dissipation technology" in which diamond is formed on the surface of a device, for example, by a CVD method are effective.

Here, in the case where a diamond film is to be formed, for example, by a CVD method, the film formation temperature is as high as approximately 700° C. to approximately 900° C. and methane (CH4) and hydrogen (H2) are used as raw material gas.

Figure 9:
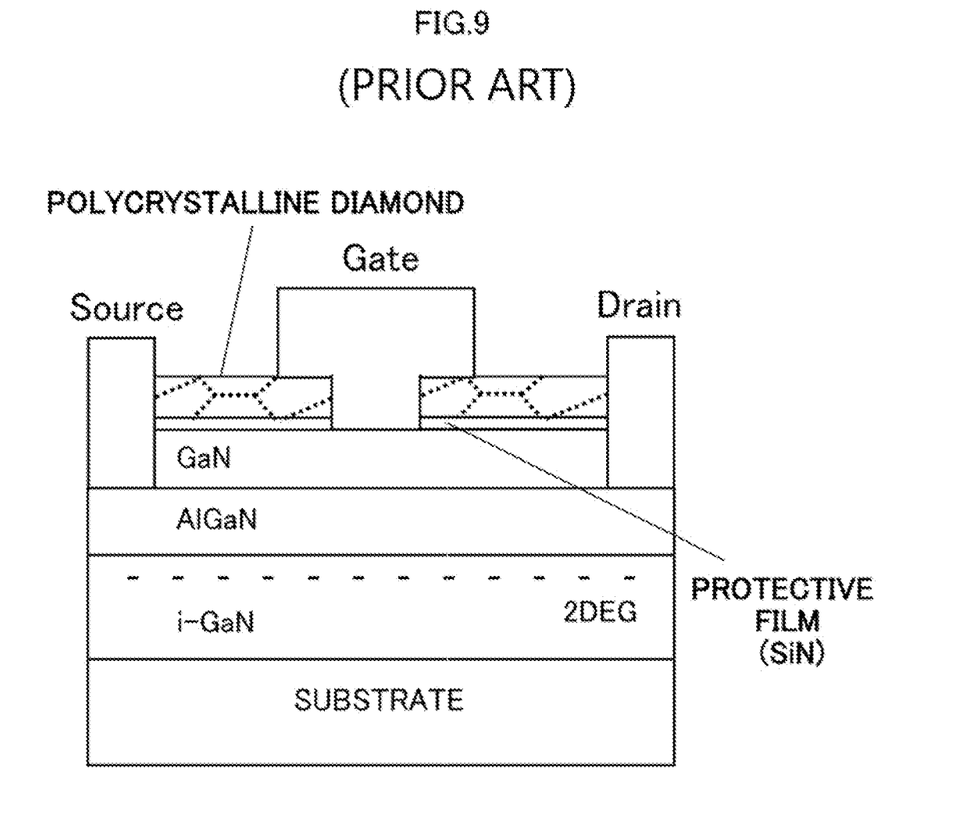
FIG. 9 is a cross sectional view depicting a configuration of a conventional compound semiconductor device.

In the case where gallium nitride (GaN) is used for the ground, since, under this condition, the GaN surface is etched by high-temperature H2, an insulating film of silicon nitride (SiN) or the like is used as a protective film for the semiconductor surface (for example, refer to FIG. 9).

On the other hand, since diamond formed, for example, by the CVD method has a polycrystalline structure, graphite comes to exist as impurity at the grain interfaces (for example, refer to FIG. 9). The graphite has a thermal conductivity lower than that of the diamond and makes a cause of inhibition of a heat dissipation effect.

It is to be noted that, in FIG. 9, a dotted line in the polycrystalline diamond film indicates a grain boundary and graphite existing in the grain boundary.

Therefore, it is effective to increase, upon film formation, the size of crystal grains to reduce the grain boundaries and remove the graphite.

Therefore, such a configuration and a fabrication method as described above are adopted.

In particular, in the present embodiment, titanium oxide (or a material containing titanium oxide as a main component) that forms an insulating film having a photocatalyst function is used as the surface protective film 9 upon diamond film formation and ultraviolet rays are irradiated during formation of the polycrystalline diamond film 10 (or after formation of the polycrystalline diamond film 10) (for example, refer to FIG. 2) to generate active oxygen in the atmosphere such that the graphite at the grain interfaces is selectively removed by the active oxygen.

As a result, the thermal conductivity of the polycrystalline diamond film 10 is improved and effective heat dissipation can be expected.

It is to be noted that, while the protective film 9 containing titanium oxide is used and ultraviolet rays are irradiated In the present embodiment, the configuration is not limited to this, and a similar effect can be obtained when light is irradiated during formation of the polycrystalline diamond film 10 (or after, formation of the polycrystalline diamond film 10) to generate active oxygen.

In this case, the fabrication method for the compound semiconductor device is configured such that it includes a step of forming a compound semiconductor stack structure 5, another step of forming a protective film 9X on the compound semiconductor stack structure 5 and a further step of forming a polycrystalline diamond film 10 on the protective film 9X and, at the step of forming a polycrystalline diamond film 10, light is irradiated to generate active oxygen during formation of the polycrystalline diamond film 10 or after formation of the polycrystalline diamond film 10 (for example, refer to FIGS. 1 and 2).

Then, by using the protective film 9 containing titanium oxide (or a material containing titanium oxide as a main component), which is an insulating film having a photocatalyst function, for the protective film 9X, selective removal of the graphite at the grain interfaces by active oxygen can be promoted.

In this case, the fabrication method for the compound semiconductor device is configured such that, at the step of forming the protective film 9X, the protective film 9 containing titanium oxide is formed and, at the step of forming the polycrystalline diamond film 10, ultraviolet rays are irradiated (for example, refer to FIGS. 1 and 2).

In the following description, a fabrication method for the present AlGaN/GaN-HEMT (compound semiconductor device) is described with a particular example.

First, for example, by a metal organic vapor phase epitaxy (MOVPE) method, an i-GaN channel layer 2, an i-AlGaN spacer layer (not depicted), an n-AlGaN electron supply layer 3 and a GaN cap layer 4 are stacked in order on an SiC substrate (semiconductor substrate) 1 to form a compound semiconductor stack structure 5 (for example, refer to FIG. 1). It is to be noted that a molecular beam epitaxy (MBE) method or the like may be used in place of the MOVPE method.

Then, element isolation is performed, for example, by ion injection of Ar (not depicted).

Then, in order to define a source electrode region and a drain electrode region (ohmic electrode regions), for example, by a photolithography technology, a new resist film (not depicted) having openings in a source electrode planned formation region and a drain electrode planned formation region is provided on the compound conductor stack structure 5.

Then, a source electrode 7 and a drain electrode 8 are formed on the n-AlGaN electron supply layer 3 (for example, refer to FIG. 1).

In particular, a resist film having openings in the source electrode planned formation region and the drain electrode planned formation region is provided, for example, by a photolithography technology, and the GaN cap layer 4 in the source electrode formation planed region and the drain electrode formation planed region is removed by dry etching using, for example, chlorine gas.

Then, after Ti/Al is stacked on the overall face, the Ti/Al deposited on the resist film is removed together with the resist film (namely, by a lift off method) to form a Ti/Al layer on the n-AlGaN electron supply layer 3 in the source electrode planned formation region and the drain electrode planned formation region, and then, heat treatment is performed at a temperature of approximately 400° C. to approximately 1000° C., for example, in a nitride atmosphere to establish an ohmic characteristic.

In this manner, the source electrode 7 and the drain electrode 8 formed, for example, from the Ti/Al layer are formed on the n-AlGaN electron supply layer 3 (for example, refer to FIG. 1).

Then, a titanium oxide film 9A is formed as the protective film 9 for the semiconductor surface (for example, refer to FIG. 1).

Here, the titanium oxide film 9A is the protective film 9 is formed so as to cover the semiconductor surface between the source electrode 7 and the gate electrode 6 and the semiconductor surface between the drain electrode 8 and the gate electrode 6.

In particular, a titanium oxide film of approximately 1 to approximately 100 nm is formed, for example, by an ALD (Atomic layer deposition) method. Here, the thickness of the titanium oxide film is approximately 50 nm.

Then, diamond (polycrystalline diamond film) 10 having a polycrystalline structure is formed on the protective film 9 (9A) configured from titanium oxide (for example, refer to FIG. 2).

In particular, powder diamond (seed diamond) is disposed on the titanium oxide film 9A and a polycrystalline diamond film 10 of approximately 100 to approximately 5000 nm is formed by a CVD method that additionally uses ultraviolet rays (for example, refer to FIG. 2). Here, the thickness of the polycrystalline diamond film 10 is approximately 1000 nm.

Then, the polycrystalline diamond film 10 and the titanium oxide film 9A in the gate electrode planned formation region are removed, for example, by dry etching (for example, refer to FIG. 2).

In particular, for example, by a photolithography technology, a resist film having an opening in the gate electrode planned formation region is provided, and the polycrystalline diamond film 10 is removed by dry etching using, for example, oxygen gas and the titanium oxide film is removed by dry etching using, for example, chlorine gas.

Then, a gate electrode 6 is formed so as to fill up the through-hole of the polycrystalline diamond film 10 and titanium oxide film 9A (for example, refer to FIG. 2).

In particular, for example, using a photolithography technology, a new resist film having an opening in the gate electrode planned formation region is provided first in order to define a gate electrode region.

Then, for example, Ni and Au are deposited in order on the overall face, and then the Ni/Au stacked on the resist film are removed together with the resist film (namely, by a liftoff method) to form a gate electrode 6 having, for example, a two-layer structure of Ni/Au so as to fill up the through-hole of the polycrystalline diamond film 10 and titanium oxide film 9A.

The present AlGaN/GaN-HEMT (compound semiconductor device) can be fabricated in this manner.

Accordingly, the compound semiconductor device and the fabrication method therefor according to the present embodiment have an advantageous effect that graphite at the grain interfaces of the polycrystalline diamond film 10 can be reduced and the thermal conductivity and the heat dissipation effect can be enhanced.

Figure 3:
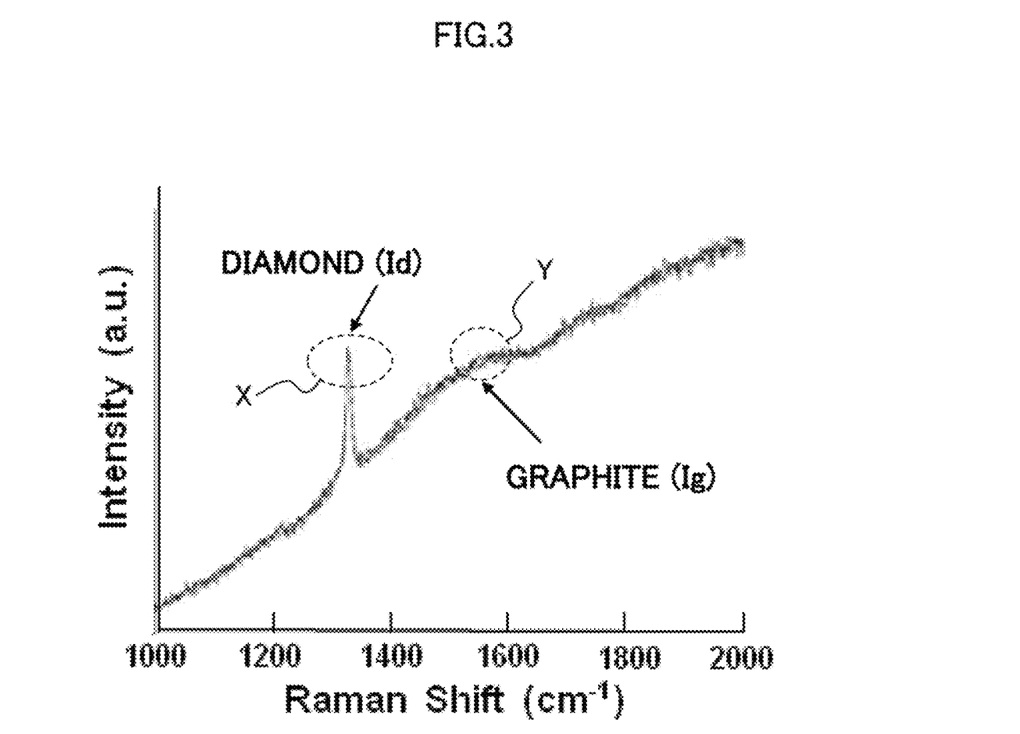
FIG. 3 is a view depicting a Raman spectrum obtained in the case where ultraviolet ray irradiation (UV irradiation) is performed after formation of a polycrystalline diamond film.

Here, FIG. 3 depicts a Raman spectrum obtained when ultraviolet ray irradiation (UV irradiation) is performed after formation of the polycrystalline diamond film 10.

It is to be noted that, in FIG. 3, a portion indicated by reference character X indicates the strength Id of the diamond at a Raman peak and another portion indicated by reference character Y indicates the strength Ig of graphite at the Raman peak.

The strength ratio between the graphite and the diamond (graphite/diamond) at the Raman peak of the polycrystalline diamond film 10 is calculated from such a Raman spectrum as depicted in FIG. 3.

Here, FIG. 4 depicts a variation of the Ig/Id strength ratio in the case where the UV irradiation time is changed.

It is to be noted that, when the UV irradiation time is made longer, then the graphite is removed and the strength Ig of the graphite at the Raman peak decreases, and the thermal conductivity is improved. Therefore, in FIG. 4, the relationship between the Ig/Id strength ratio and the thermal conductivity is depicted with the UV irradiation time and the thermal conductivity associated with each other.

As depicted in FIG. 4, when UV irradiation is performed, then the Ig/Id strength ratio decreases and the thermal conductivity increases as the UV irradiation time increases. Especially, it is preferable to set the Ig/Id strength ratio to approximately 0.4 or less by performing UV irradiation.

As a result, the heat dissipation effect in the compound semiconductor device can be enhanced. For example, the heat; dissipation efficiency of a high-output device is improved and enhancement of electric characteristics and the reliability can be implemented.

It is to be noted that, while description is given with reference to FIGS. 3 and 4 taking a case in which UV irradiation is performed after formation of the polycrystalline diamond film 10 as an example, it is expected that, when UV irradiation is performed during formation of the polycrystalline diamond film 10, then a better effect is obtained.

It is to be noted that, while, in the embodiment described above, the protective film 9 (9X) is provided between the polycrystalline diamond film 10 and the semiconductor layer (semiconductor layer configuring the surface of the compound semiconductor stack structure; here, the GaN cap layer 4), the configuration is not limited to this.

For example, the protective film 9 (9X) may be provided not only between the polycrystalline diamond film 10 and the semiconductor layer (here, cap layer 4) but also between the gate electrode 6 and the semiconductor layer (semiconductor layer configuring the surface of the compound semiconductor stack structure; here, the GaN cap layer 4).

In short, the protective film 9 (9X) may be provided also between the compound semiconductor stack structure 5 and the gate electrode 6.

In this case, the protective film 9 (9X) functions also as a gate insulating film.

Figure 5:
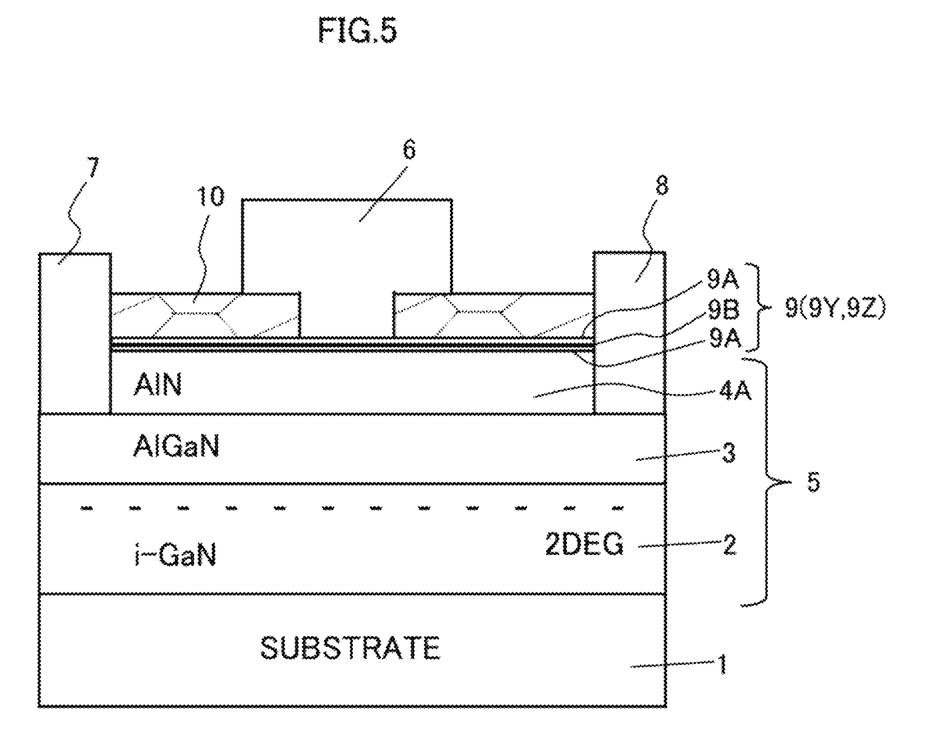
FIG. 5 is a cross sectional view depicting a configuration of a compound semiconductor device of a modification of the present embodiment.

In this case, the protective film 9 preferably includes an aluminum oxide film 9B provided on the compound semiconductor stack structure 5 and the titanium oxide film 9A provided on the aluminum oxide film 9B, for example, as depicted in FIG. 5.

In short, the protective film 9 is preferably configured as a stack film 9Y from the aluminum oxide film 9B and the titanium oxide film 9A.

Consequently, the insulation can be enhanced.

In this case, the polycrystalline diamond film 10 is provided on the titanium oxide film 9A.

In this manner, where the protective film 9 is configured as the stack film 9Y from the aluminum oxide film 9B and the titanium oxide film 9A, aluminum oxide and titanium oxide are sometimes mixed after the films 9B and 9A are stacked.

In this case, the protective film 9 is configured as a mixture film 9Z of titanium oxide and aluminum oxide. In this manner, the protective film 9 may be the mixed film 9Z of titanium oxide and aluminum oxide.

It is to be noted that the protective film 9 at the polycrystalline diamond film 10 side becomes a film containing titanium oxide as a main component, and the protective film 9 at the compound semiconductor stack structure 5 side becomes a film containing aluminum oxide as a main component.

In this manner, where the stack film 9Y of the aluminum oxide film 9B and the titanium oxide film 9A (mixed film 9Z of titanium oxide and aluminum oxide) is used as the surface protective film 9, the stack film 9Y functions also as a gate insulating film having a high dielectric constant and a high band gap.

Therefore, it is possible to form the protective film 9 also between the gate electrode 6 and the semiconductor layer (here, the GaN cap layer 4) such that the semiconductor device operates as an AlGaN/GaN-HEMT (MOS device) of the MOS (Metal Oxide Semiconductor) type.

It is to be noted that, while, in the present modification, the stack film 9Y of the aluminum oxide film 9B and the titanium oxide film 9A as the protective film 9 (mixture film 9Z of titanium oxide and aluminum oxide) is provided also between the compound semiconductor stack structure 5 and the gate electrode 6, this is not restrictive, and the stack film 9Y may be provided between the polycrystalline diamond film 10 and the semiconductor layer (here, the GaN cap layer 4) similarly as in the case of the embodiment described hereinabove.

In the following, a particular example is described.

First, for example, by an MOVPE method, an i-GaN channel layer 2, an i-AlGaN spacer layer (not depicted), an n-AlGaN electron supply layer 3 and a GaN cap layer 4A are stacked in order on an SiC substrate (semiconductor substrate) 1 to form a compound semiconductor stack structure 5 (for example, refer to FIG. 5).

Then, element isolation is performed, for example, by ion injection of Ar (not depicted).

Then, in order to define a source electrode region and a drain electrode region (ohmic electrode regions), for example, by a photolithography technology, a new resist film (not depicted) having openings in a source electrode planned formation region and a drain electrode planned formation region is provided on the compound conductor stack structure 5.

Then, a source electrode 7 and a drain electrode 8 are formed on the n-AlGaN electron supply layer 3 (for example, refer to FIG. 5).

In particular, a resist film, having openings in the source electrode planned formation region and the drain electrode planned formation region is provided, for example, by a photolithography technology, and the ALN cap layer 4A in the source electrode formation planed region and the drain electrode formation planed region is removed by dry etching using, for example, chlorine gas (for example, refer to FIG. 5).

Then, after Ti/Al is stacked on the overall face, the Ti/Al deposited on the resist; film is removed together with the resist film (namely, by a lift off method) to form a Ti/Al layer on the n-AlGaN electron supply layer 3 in the source electrode planned formation region and the drain electrode planned formation region, and then, heat treatment is performed at a temperature of approximately 400° C. to approximately 1000° C., for example, in a nitride atmosphere to establish an ohmic characteristic.

In this manner, the source electrode 7 and the drain electrode 8 formed, for example, from the Ti/Al layer are formed on the n-AlGaN electron supply layer 3 (for example, refer to FIG. 5).

Then, a stack film 9Y of a titanium oxide film 9A and an aluminum oxide film 9B (mixture film 9Z of titanium oxide and aluminum oxide) is formed as the protective film 9 for the semiconductor surface (for example, refer to FIG. 5).

Here, the stack film 9Y (mixture film 9Z) as the protective film 9 is formed so as to cover the semiconductor surface between the source electrode 7 and the gate electrode 6 and the semiconductor surface between the drain electrode 8 and the gate electrode 6 (for example, refer to FIG. 5).

In particular, a titanium oxide film 9A and an aluminum oxide film 9B are formed alternately each with a thickness of approximately 1 to 10 nm such that a stack film 9Y of such titanium oxide films 9A and aluminum oxide films 9B (mixture film of 9Z of titanium oxide and aluminum oxide) is formed as the stack structure of a totaling thickness of approximately 2 to approximately 100 nm, by the ALD method. Here, the thickness of the stack film 9Y is approximately 50 nm.

Figure 6:
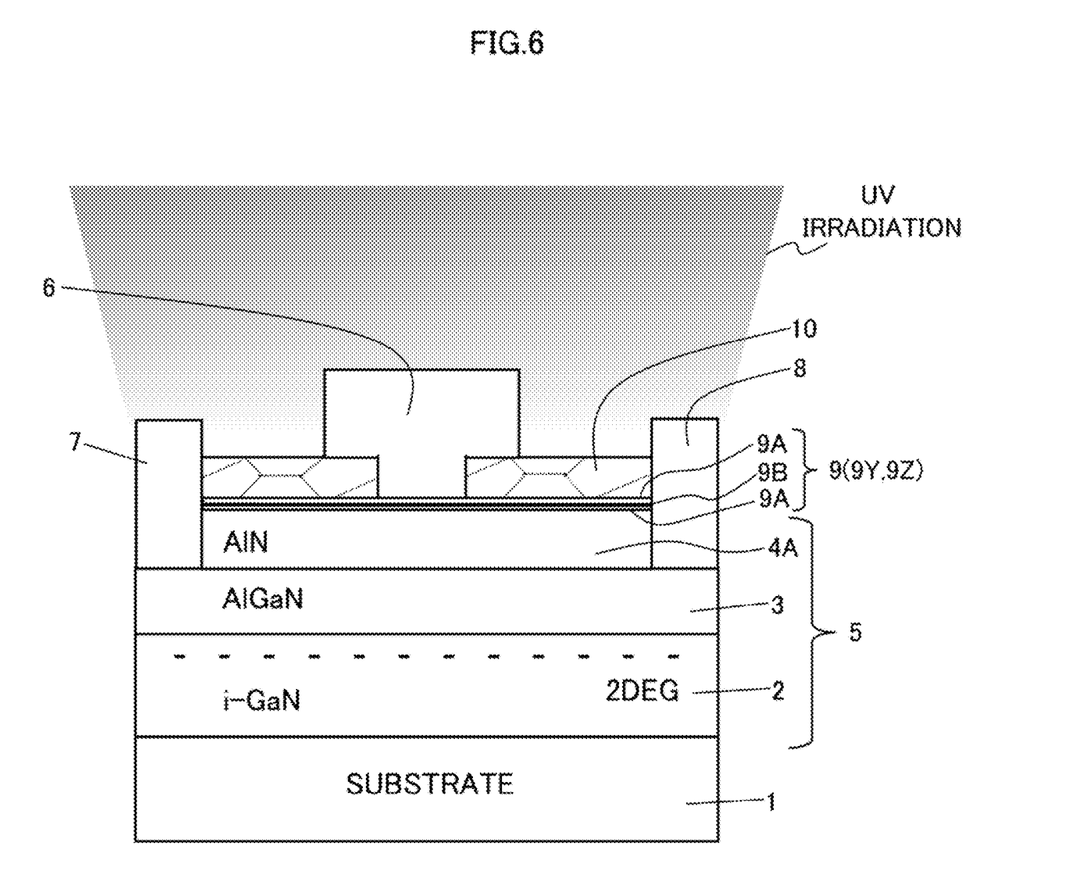
FIG. 6 is a cross sectional view illustrating a fabrication method for a compound semiconductor device of the modification to the present embodiment.

Then, diamond (polycrystalline diamond film) 10 having a polycrystalline structure is formed on the protective film 9 configured from titanium oxide and aluminum oxide (for example, refer to FIG. 6).

In particular, powdered diamond (seed diamond) is disposed on the titanium oxide film and a polycrystalline diamond film 10 of approximately 100 to approximately 5000 nm is formed by a CVD method that additionally uses ultraviolet rays (for example, refer to FIG. 6). Here, the thickness of the polycrystalline diamond film 10 is approximately 1000 nm.

Then, the polycrystalline diamond film 10 in the gate electrode planned formation region is removed, for example, by dry etching (for example, refer to FIG. 6).

In particular, for example, by a photolithography technology, a resist film having an opening in the gate electrode planned formation region is provided, and the polycrystalline diamond film 10 is removed by dry etching using, for example, oxygen gas.

Then, a gate electrode 6 is formed so as to fill up the through-hole of the polycrystalline diamond film 10 (for example, refer to FIG. 6).

In particular, for example, using a photolithography technology, a new resist film having an opening in the gate electrode planned formation region is provided first in order to define agate electrode region.

Then, for example, Ni and Au are deposited in order on the overall face, and then the Ni/Au stacked on the resist film are removed together with the resist film (namely, by a liftoff method) to form a gate electrode 6 having, for example, a two-layer structure of Ni/Au so as to fill up the through-hole of the polycrystalline diamond film 10.

The AlGaN/GaN-HEMT (compound semiconductor device) can be fabricated in this manner.

It is to be noted that, although, in the present modification, the case in which the stack film 9Y of the aluminum oxide film 9B and the titanium oxide film 9A (mixture film 9Z of titanium oxide and aluminum oxide) is used as the protective film 9 is described as an example, this is not restrictive.

Figure 7:
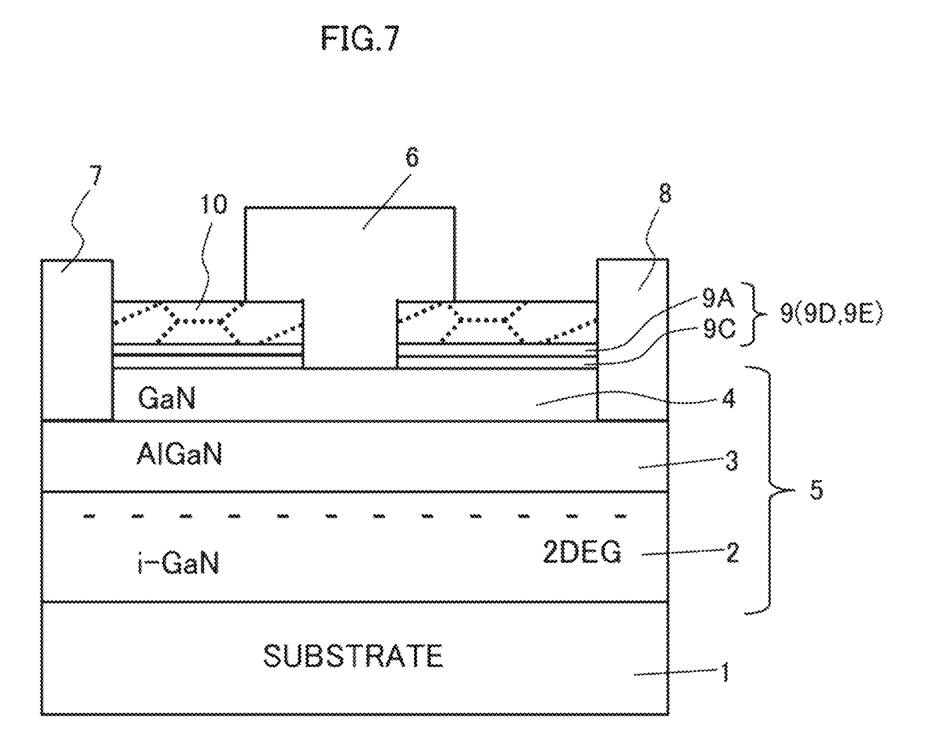
FIG. 7 is a cross sectional view depicting a configuration of a compound semiconductor device of another modification of the present embodiment.

For example, a stack film 9D of a silicon nitride film 9C and a titanium oxide film 9A (mixture film 9E of titanium oxide and silicon nitride) may be used as the protective film 9 as depicted in FIG. 7.

In particular, the protective film 9 may include a silicon nitride film 9C provided on the compound semiconductor stack structure 5 and a titanium oxide film 9A provided on the silicon nitride film 9C. In short, the protective film 9 may be a stack film 9D of the silicon nitride film 9C and the titanium oxide film 9A. The insulation can be improved by the configuration. In this case, the polycrystalline diamond film 10 is provided on the titanium oxide film 9A.

In the case where the protective film 9 is configured as the stack film 9D of the silicon nitride film 9C and the titanium oxide film 9A in this manner, titanium oxide and silicon nitride sometimes mix with each other after the films 9C and 9A are stacked. In this case, the protective film 9 becomes a mixture film 9E of titanium oxide and silicon nitride. In this manner, the protective film 9 may be the mixture film 9E of titanium oxide and silicon nitride. It is to be noted that the protective film 9 at the polycrystalline diamond film 10 side becomes a film that includes titanium oxide as a main component and the protective film 9 at the compound semiconductor stack structure 5 side becomes a film that includes silicon nitride as a main component.

In this case, the stack, film 9D of the silicon nitride film 9C and the titanium oxide film 9A as the protective film 9 (mixture film 9E of titanium oxide and silicon nitride) may be provided between the polycrystalline diamond film 10 and the semiconductor layer (here, the GaN cap layer 4) similarly as in the case of the embodiment described hereinabove.

It is to be noted that, while, in the embodiment and the modification described above, an AlGaN/GaN-HEMT is taken as an example of the compound semiconductor device, this is not restrictive. For example, it is possible to apply the present technology also to a compound semiconductor device (nitride semiconductor device) in which InAlN, InGaAlN or the like is used.

Second Embodiment

Now, an amplification unit according to a second embodiment is described with reference to FIG. 8.

The an amplification unit according to the present embodiment is a high frequency amplification unit that includes one of the compound semiconductor devices (HEMTs) of the first embodiment and the modification described above.

Figure 8:
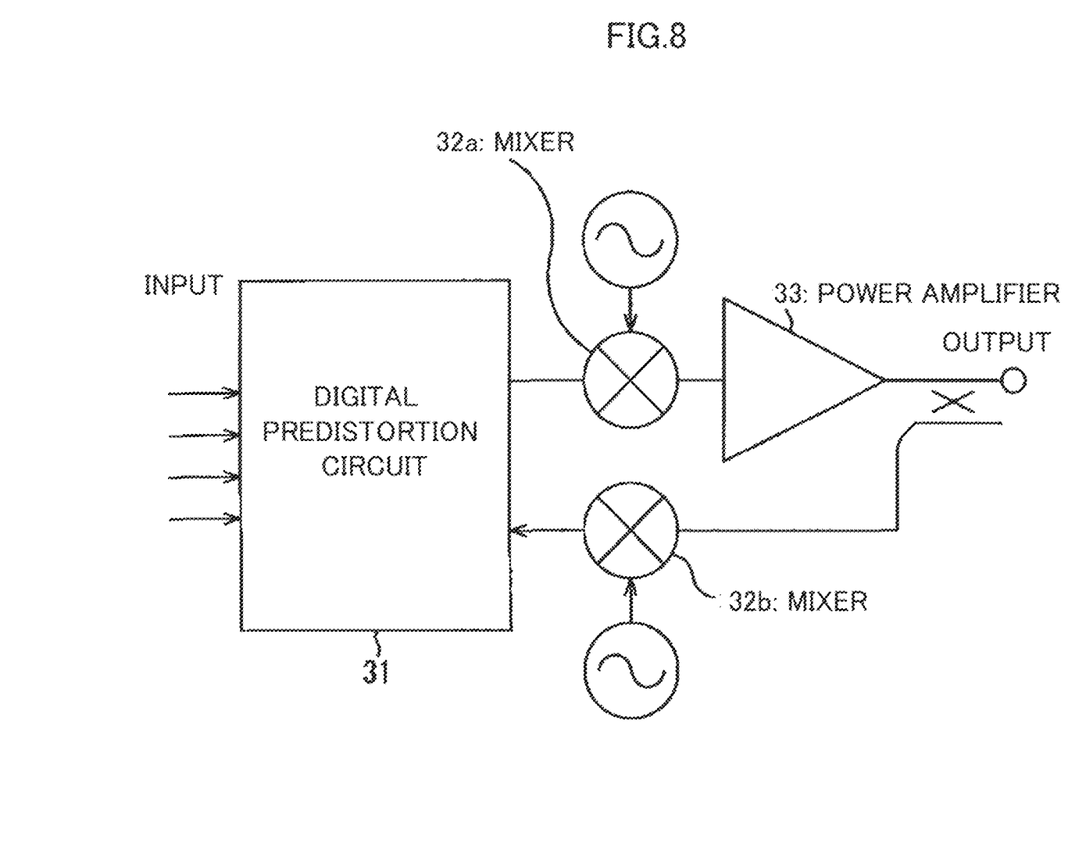
FIG. 8 is a view depicting a configuration of an amplification unit according to the present embodiment.

The present high frequency amplification unit includes a digital predistortion circuit 31, mixers 32a and 32b and a power amplifier 33 as depicted in FIG. 8. It is to be noted that the power amplifier is hereinafter referred to merely as amplifier.

The digital predistortion circuit 31 compensates for nonlinear distortion of an input signal.

The mixers 32a and 32b mix the input signal whose nonlinear distortion is compensated for and an AC signal.

The power amplifier 33 amplifies the input signal, mixed with the AC signal and includes an HEMT of one of the first embodiment and the modification described above.

It is to be noted that the amplification unit depicted in FIG. 8 is configured such that a signal at the output side can be mixed with the AC signal by the mixer 32b and sent out to the digital predistortion circuit 31, for example, by switching of a switch.

Accordingly, with the amplification unit according to the present embodiment, since the compound semiconductor device (HEMT) according to any of the first embodiment and the modification described above is applied to the power amplifier 33, there is an advantageous effect that a high frequency amplification unit of high reliability can be implemented.

Others

It is to be noted that, the present technology is not limited to the configurations described hereinabove in connection with the embodiments and the modifications and can be modified in various manners without departing from the subject matter of the present technology.

As one aspect, the technology disclosed herein has an advantageous effect that it is possible to reduce graphite at the grain boundaries of a polycrystalline diamond film to improve the thermal conductivity and increase the heat dissipation effect.

All examples and conditional language recited herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A compound semiconductor device, comprising:
a compound semiconductor stack structure;
a protective film provided on the compound semiconductor stack structure and containing titanium oxide; and
a polycrystalline diamond film provided on the protective film.

2. The compound semiconductor device according to claim 1, further comprising:
a gate electrode provided over the compound semiconductor stack structure; and wherein
the protective film is provided also between the compound semiconductor stack structure and the gate electrode.

3. The compound semiconductor device according to claim 1, wherein the protective film is a mixture film of titanium oxide and aluminum oxide.

4. The compound semiconductor device according to claim 1, wherein the protective film includes an aluminum oxide film provided on the compound semiconductor stack structure and a titanium oxide film provided on the aluminum oxide film; and
the polycrystalline diamond film is provided on the titanium oxide film.

5. The compound semiconductor device according to claim 1, wherein the protective film is a mixture film of titanium oxide and silicon nitride.

6. The compound semiconductor device according to claim 1, wherein the protective film includes a silicon nitride film provided on the compound semiconductor stack structure and a titanium oxide film provided on the silicon nitride film; and
the polycrystalline diamond film is provided on the titanium oxide film.

7. The compound semiconductor device according to claim 1, wherein a strength ratio (graphite/diamond) between graphite and diamond at a Raman peak of the polycrystalline diamond film is 0.4 or less.

8. The compound semiconductor device according to claim 1, wherein the protective film has a function as an insulating film and a photocatalyst.

9. The compound semiconductor device according to claim 1, wherein the compound semiconductor stack structure is a nitride semiconductor stack structure including an electron supply layer and an electron transit layer.

10. An amplification unit, comprising:
an amplifier that amplifies an input signal; and wherein
the amplifier includes a transistor; and
the transistor includes:
a compound semiconductor stack structure;
a protective film provided on the compound semiconductor stack structure and containing titanium oxide; and
a polycrystalline diamond film provided on the protective film.

11. A fabrication method for a compound semiconductor device, comprising:
forming a compound semiconductor stack structure;
forming a protective film containing titanium oxide on the compound semiconductor stack structure; and
forming a polycrystalline diamond film on the protective film.

12. The fabrication method for a compound semiconductor device according to claim 11, wherein, at the forming a polycrystalline diamond film, active oxygen is generated by irradiating ultraviolet light during or after the formation of the polycrystalline diamond film.

* * * * *